United States Patent
Halley

(10) Patent No.: US 6,361,647 B1
(45) Date of Patent: Mar. 26, 2002

(54) METHOD AND APPARATUS FOR CHEMICAL MECHANICAL POLISHING

(75) Inventor: David G. Halley, Los Osos, CA (US)

(73) Assignee: Stras Baugh, San Luis Obispo, CA (US)

(*) Notice: Subject to any disclaimer, the term of this patent is extended or adjusted under 35 U.S.C. 154(b) by 0 days.

(21) Appl. No.: 09/432,144

(22) Filed: Nov. 2, 1999

Related U.S. Application Data

(63) Continuation-in-part of application No. 09/407,472, filed on Sep. 28, 1999.

(51) Int. Cl.[7] .............................................. B24B 7/22
(52) U.S. Cl. ......................... 156/345; 451/66; 451/278
(58) Field of Search .......................... 156/346; 451/66, 451/278, 287, 292

(56) References Cited

U.S. PATENT DOCUMENTS

| | | | |
|---|---|---|---|
| 5,664,987 A | 9/1997 | Renteln | 451/21 |
| 5,792,709 A | 8/1998 | Robinson et al. | 438/692 |
| 5,938,504 A | 8/1999 | Talieh | 451/11 |
| 5,975,994 A | * 11/1999 | Sandhu et al. | 451/56 |
| 5,980,647 A | * 11/1999 | Buker et al. | 134/33 |
| 6,022,807 A | 2/2000 | Lindsey, Jr. et al. | 438/693 |

* cited by examiner

Primary Examiner—Gregory Mills
Assistant Examiner—Sylvia R. MacArthur
(74) Attorney, Agent, or Firm—Townsend and Townsend and Crew LLP

(57) ABSTRACT

A chemical mechanical polishing method and apparatus (100) includes a control mechanism (190) having control programs for operating the apparatus in accordance with the invention. The apparatus includes a memory store (192) for containing an offset distance and an additional memory store for containing a velocity profile. A polish operation is achieved either by providing a polishing path based on the offset distance. A method (FIG. 7) and system (FIG. 8) for calibrating a polishing apparatus includes iteratively selecting an offset distance, performing a polish, inspecting the resulting removal profile, and repeating until a desired characteristic in the removal profile is attained.

19 Claims, 8 Drawing Sheets

METHOD AND APPARATUS FOR CHEMICAL MECHANICAL POLISHING

CROSS-REFERENCES TO RELATED APPLICATIONS

This application is a continuation-in-part of U.S. application Ser. No. 09/407,472, filed Sep. 28, 1999, entitled "Method for Chemical Mechanical Polishing," both of which are commonly owned by the Assignee of the present application, the entire contents of which is expressly incorporated herein by reference for all purposes.

BACKGROUND OF THE INVENTION

The present invention relates to the manufacture of electronic devices. More particularly, the invention provides a technique including a method and device for planarizing a film of material of an article such as a semiconductor wafer. However, it will be recognized that the invention has a wider range of applicability; it can also be applied to flat panel displays, hard disks, raw wafers, and other objects that require a high degree of planarity.

The fabrication of integrated circuit devices often begins by producing semiconductor wafers cut from an ingot of single crystal silicon which is formed by pulling a seed from a silicon melt rotating in a crucible. The ingot is then sliced into individual wafers using a diamond cutting blade. Following the cutting operation, at least one surface (process surface) of the wafer is polished to a relatively flat, scratch-free surface. The polished surface area of the wafer is first subdivided into a plurality of die locations at which integrated circuits (IC) are subsequently formed. A series of wafer masking and processing steps are used to fabricate each IC. Thereafter, the individual dice are cut or scribed from the wafer and individually packaged and tested to complete the device manufacture process.

During IC manufacturing, the various masking and processing steps typically result in the formation of topographical irregularities on the wafer surface. For example, topographical surface irregularities are created after metallization, which includes a sequence of blanketing the wafer surface with a conductive metal layer and then etching away unwanted portions of the blanket metal layer to form a metallization interconnect pattern on each IC. This problem is exacerbated by the use of multilevel interconnects.

A common surface irregularity in a semiconductor wafer is known as a step. A step is the resulting height differential between the metal interconnect and the wafer surface where the metal has been removed. A typical VLSI chip on which a first metallization layer has been defined may contain several million steps, and the whole wafer may contain several hundred ICs.

Consequently, maintaining wafer surface planarity during fabrication is important. Photolithographic processes are typically pushed close to the limit of resolution in order to create maximum circuit density. Typical device geometries call for line widths on the order of 0.5 $\mu$M. Since these geometries are photolithographically produced, it is important that the wafer surface be highly planar in order to accurately focus the illumination radiation at a single plane of focus to achieve precise imaging over the entire surface of the wafer. A wafer surface that is not sufficiently planar, will result in structures that are poorly defined, with the circuits either being nonfunctional or, at best, exhibiting less than optimum performance. To alleviate these problems, the wafer is "planarized" at various points in the process to minimize non-planar topography and its adverse effects. As additional levels are added to multilevel-interconnection schemes and circuit features are scaled to submicron dimensions, the required degree of planarization increases. As circuit dimensions are reduced, interconnect levels must be globally planarized to produce a reliable, high density device. Planarization can be implemented in either the conductor or the dielectric layers.

In order to achieve the degree of planarity required to produce high density integrated circuits, chemical-mechanical planarization processes ("CMP") are being employed with increasing frequency. A conventional rotational CMP apparatus includes a wafer carrier for holding a semiconductor wafer. A soft, resilient pad is typically placed between the wafer carrier and the wafer, and the wafer is generally held against the resilient pad by a partial vacuum. Alternatively, the wafer is pushed against the pad in a configuration which applies a back-pressure to the wafer. This arrangement provides a certain degree of compliance for the wafer during polishing. The wafer carrier is designed to be continuously rotated by a drive means. In addition, the wafer carrier typically is also designed for transverse movement. The rotational and transverse movement is intended to reduce variability in material removal rates over the surface of the wafer. The apparatus further includes a rotating platen on which is mounted a polishing pad. The platen is relatively large in comparison to the wafer, so that during the CMP process, the wafer may be moved across the surface of the polishing pad by the wafer carrier. A polishing slurry containing chemically-reactive solution, in which are suspended abrasive particles, is deposited through a supply tube onto the surface of the polishing pad.

CMP is advantageous because it can be performed in one step, in contrast to prior planarization techniques which tend to be more complex, involving multiple steps. For example, planarization of CVD interlevel dielectric films can be achieved by a sacrificial layer etchback technique. This involves coating the CVD dielectric with a film which is then rapidly etched back (sacrificed) to expose the topmost portions of the underlying dielectric. The etch chemistry is then changed to provide removal of the sacrificial layer and dielectric at the same rate. This continues until all of the sacrificial layer has been etched away, resulting in a planarized dielectric layer.

Chemical-mechanical polishing is a well developed planarization technique. The underlying chemistry and physics of the method is understood. Certain limitations, however, exist with CMP. Specifically, CMP often involves a large polishing pad, which uses a large quantity of slurry material. The large polishing pad is often difficult to control and requires expensive and difficult to control slurries. Additionally, the large polishing pad is often difficult to remove and replace. The large pad is also expensive and consumes a large foot print in the fabrication facility. These and other limitations still exist with CMP and the like.

A recent advance is the use of a face-up polishing scheme in which the wafer is arranged in a face-up position. A pad having a smaller diameter than that of the wafer is brought down upon the surface to perform the polishing action. With this technique, however, it is very difficult to obtain smooth results near the center of the wafer. The result is a planarized wafer whose center region may or may not be suitable for subsequent processing. Sometimes, therefore, it is not possible to fully utilize the entire surface of the wafer. This reduces yield and subsequently increases the per-chip manufacturing cost with the consumer ultimately bearing the cost.

It is therefore desirable to maximize the useful surface of a semiconductor wafer to increase chip yield. What is needed is an improvement of the CMP technique to improve the degree of global uniformity that can be achieved using CMP.

SUMMARY OF THE INVENTION

A polishing apparatus according to the invention includes a chuck assembly for supporting a wafer to be polished. A pad assembly having a translation stage positions a polishing pad relative to a wafer to be polished. A controller provides control signals to operate the chuck and pad assemblies during a polish operation. The controller includes a data store for storing an offset distance and a velocity profile. The controller further includes control outputs to position the pad according to the stored offset distance and to translate the pad according to the stored velocity profile during polishing.

In accordance with the invention, the pad offset distance is determined by selecting a first offset distance. The pad is positioned relative to a test wafer based on this first offset distance. A polish of the test wafer is performed. The pad is translated at a constant velocity across the wafer. A removal profile of the resulting polished test wafer is then produced. Based on the characteristics of the removal profile, a second offset distance is selected and the process is repeated on a second test wafer. The subsequent pad offset distance may be greater than or less than the previous offset distance. When a desired removal profile is achieved, the corresponding offset distance is stored. A velocity profile is then generated based on the shape of the removal profile. Thus, in a subsequent polish of a production wafer, the polishing pad is positioned based on the offset distance and translated across the wafer in accordance with the velocity profile to produce a high quality polish exhibiting global uniform planarity of the wafer surface.

In another embodiment, a method and apparatus for polishing includes a chuck assembly for supporting a wafer to be polished. The wafer having an axis of rotation. A pad assembly having a traverse mechanism positions a polishing pad relative to a wafer to be polished. A controller provides control signals to operate the chuck and pad assemblies during a polish operation. The controller includes control outputs to apply and remove pad downforce to the pad depending on the separation distance between the wafer axis and the pad axis.

In yet another embodiment of the invention, a method for calibrating a polishing apparatus includes providing a test wafer, providing a first offset distance, and polishing the test wafer based on the first offset distance. A removal profile is determined and a second offset distance is produced based on the removal profile. The process is repeated until a desired removal profile is attained.

In still yet another embodiment of the invention, a calibration system for a polishing apparatus includes a wafer supply, a polishing station, a measurement station, and a wafer transport mechanism. The wafer transport carries wafers from the wafer supply to the polishing station, from the polishing station to the measurement station, and from the measurement system back to the wafer supply. A controller includes program code to perform the foregoing functions. In addition, the controller includes program code to select an offset distance and to perform a polish by positioning the pad based on the offset distance and translating the pad at a constant velocity. The wafer is then transferred to the measurement station where additional program code operates the measurement station to generate a removal profile. The selected offset distance is then updated based on the removal profile and another wafer is polished using the updated offset distance. When an acceptable removal profile is attained, the corresponding offset distance is saved and a velocity profile is generated based on the acceptable removal profile.

The present invention achieves these benefits in the context of known process technology and known techniques in the mechanical arts. However, a further understanding of the nature and advantages of the present invention may be realized by reference to the latter portions of the specification and attached drawings.

DESCRIPTION OF THE SPECIFIC EMBODIMENTS

Figure 1A:
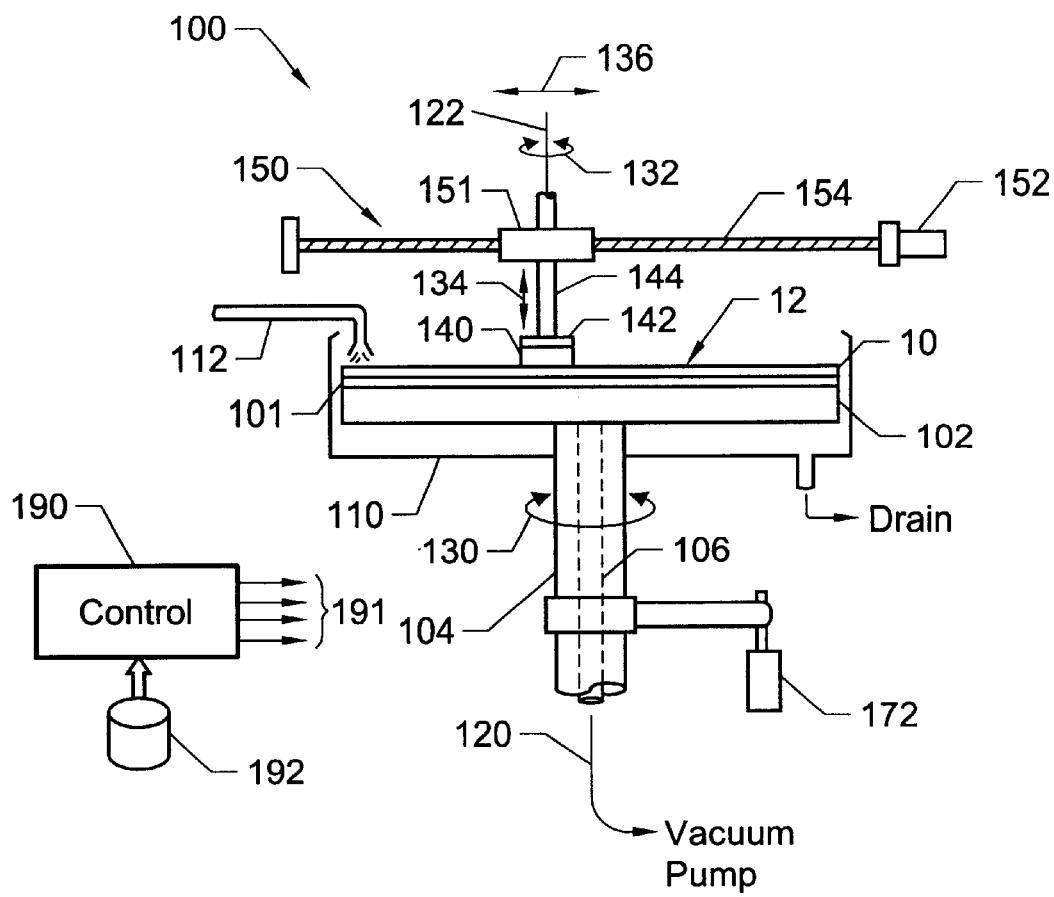
FIG. 1A shows a simplified polishing apparatus in accordance with an embodiment of the present invention.

Referring to FIG. 1A, a chemical-mechanical polishing apparatus 100 according to the invention includes a chuck 102 for holding a wafer 10 in position during a polishing operation. The apparatus shown is merely an example and has been simplified to facilitate a discussion of the salient aspects of the invention. As such, the figure should not unduly limit the scope of the claims herein. One of ordinary skill in the art would recognize many other variations, alternatives, and modifications.

The chuck includes a drive spindle 104 which is coupled to a motor 172 via a drive belt 174 to rotate the wafer about its axis 120. Preferably, the motor is a variable-speed device so that the rotational speed of the wafer can be varied. In addition, the direction of rotation of the motor can be reversed so that the wafer can be spun in either a clockwise direction or a counterclockwise direction. Typically, servo motors are used since their speed can be accurately controlled, as well as their direction of rotation. Alternative drive means include, but are not limited to, direct drive and gear-driven arrangements.

A channel 106 formed through spindle 104 is coupled to a vacuum pump through a vacuum rotary union (not shown). Chuck 102 may be a porous material, open to ambient at its upper surface so that air drawn in from the surface through channel 106 creates a low pressure region near the surface. A wafer placed on the chuck surface is consequently held in place by the resulting vacuum created between the wafer and the chuck. Alternatively, chuck 102 may be a solid material having numerous channels formed through the upper surface, each having a path to channel 106, again with the result that a wafer placed atop the chuck will be held in position by a vacuum. Such vacuum-type chucks are known and any of a variety of designs can be used with the invention. In fact, mechanical clamp chucks can be used. However, these types are less desirable because the delicate surfaces of the wafer to be polished can be easily damaged by the clamping mechanism. In general, any equivalent method for securing the wafer in a stationary position and allowing the wafer to be rotated would be equally effective for practicing the invention.

A wafer backing film 101 is disposed atop the surface of chuck 102. The backing film is a polyurethane material. The material provides compliant support structure which is typically required when polishing a wafer. When a compliant backing is not used, high spots on a wafer prevent the pad from contacting the thinner areas (low spots) of the wafer. The compliant backing material permits the wafer to deflect enough to flatten its face against the polish pad. There can be a deflection of several thousands of an inch deflection under standard polishing forces. Polyurethane is not necessary, however, as any appropriate compliant support material will work equally well in this invention.

FIG. 1A also shows a polishing pad assembly comprising a polishing pad 140, a chuck 142 for securing the pad in position, and a pad spindle 144 coupled to the chuck for rotation of the pad about its axis 122. In accordance with the invention, the pad radius is less than the radius of wafer 10, typically around 20% of the wafer radius. A drive motor (not shown) is coupled to pad spindle 144 to provide rotation of the pad. Preferably, the drive motor is a variable-speed device so that the rotational speed of pad 140 during a particular polishing operation can be controlled. The drive motor preferably is reversible.

Figure 1B:
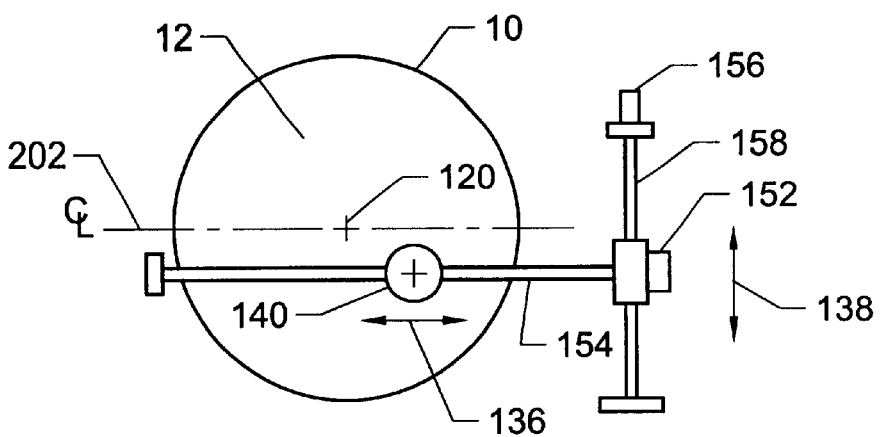
FIG. 1B is a simplified overhead view of the arrangement of an x-y translation stage in relation to a wafer to be polished.

Referring to FIGS. 1A and 1B, a traverse mechanism 150 provides translational displacement of the polishing pad assembly across the wafer surface. In one embodiment of the invention, the traverse mechanism is an x-y translation stage that includes a platform 151 for carrying the pad assembly. The traverse mechanism 150 further includes drive screws 154 and 158, each respectively driven by motors 152 and 156 to move platform 151. Motors 152 and 156 respectively translate platform 151 in the x-direction, indicated by reference numeral 136, and in the y-direction, indicated by reference numeral 138. Motors 152 and 156 preferably are variable-speed devices so that the translation speed can be controlled during polishing. Stepper motors are typically used to provide high accuracy translation and repeatability.

It is noted that the function of traverse mechanism 150 can be provided by other known translation mechanisms as alternatives to the aforementioned x-y translation stage. Alternative mechanisms include pulley-driven devices and pneumatically operated mechanisms. The present invention would be equally effective regardless of the particular mechanical implementation selected for the translation mechanism.

Continuing with FIG. 1A, the pad 140 is oriented relative to wafer 10 such that process surface 12 of the wafer is substantially horizontal and faces upwardly. The polishing surface of pad 140 is lowered onto process surface 12 of the wafer. This arrangement of wafer surface to pad surface is preferred. If a power failure occurs, the various components in the CMP apparatus will likely cease to operate. In particular, the vacuum system is likely to stop functioning. Consequently, wafer 10 will no longer be held securely in place by vacuum chuck 102. However, since the wafer is already in a neutral position, the wafer will not fall and become damaged when the chuck loses vacuum but will simply rest upon the chuck.

The pad assembly is arranged on the translation stage of traverse mechanism 150 to allow for motion in the vertical direction which is indicated in FIG. 1A by reference numeral 134. This allows for lowering the pad onto the wafer surface for the polishing operation. Preferably, pad pressure is provided by an actuator (e.g., a piston-driven mechanism, voice coil, servo motor, lead screw assembly, and the like) having variable-force control in order to control the downward pressure of the pad upon the wafer surface. The actuator is typically equipped with a force transducer to provide a downforce measurement which can be readily converted to a pad pressure reading. Numerous pressure-sensing actuator designs, known in the relevant engineering arts, can be used.

A slurry delivery mechanism 112 is provided to dispense a polishing slurry onto process surface 12 of wafer 10 during a polishing operation. Although FIG. 1A shows a single dispenser 122, additional dispensers may be provided depending on the polishing requirements of the wafer. Polishing slurries are known in the art. For example, typical slurries include a mixture of colloidal silica or dispersed alumina in an alkaline solution such as KOH, $NH_4OH$ or $CeO_2$. Alternatively, slurry-less pad systems can be used.

A splash shield 110 is provided to catch the polishing fluids and to protect the surrounding equipment from the caustic properties of any slurries that might be used during polishing. The shield material can be polypropylene or stainless steel, or some other stable compound that is resistant to the corrosive nature of polishing fluids.

A controller 190 in communication with a data store 192 issues various control signals 191 to the foregoing-described components of polishing apparatus 100. The controller provides the sequencing control and manipulation signals to the mechanics to effectuate a polishing operation. The data store 192 preferably is externally accessible. This permits user-supplied data to be loaded into the data store to provide polishing apparatus 100 with the parameters for performing a polishing operation. This aspect of the preferred embodiment will be further discussed below.

Any of a variety of controller configurations are contemplated for the present invention. The particular configuration will depend on considerations such as throughput requirements, available footprint for the apparatus, system features other than those specific to the invention, implementation costs, and the like. In one embodiment, controller 190 is a personal computer loaded with control software. The personal computer includes various interface circuits to each component of polishing apparatus 100. The control software communicates with these components via the interface circuits to control apparatus 100 during a polishing operation. In this embodiment, data store 192 can be an internal hard drive containing desired polishing parameters. User-supplied parameters can be keyed in manually via a keyboard (not shown). Alternatively, data store 192 is a floppy drive in which case the parameters can be determined elsewhere, stored on a floppy disk, and carried over to the personal computer. In yet another alternative, data store 192 is a remote disk server accessed over a local area network.

In still yet another alternative, the data store is a remote computer accessed over the Internet; for example, by way of the world wide web, via an FTP (file transfer protocol) site, and so on.

In another embodiment, controller 190 includes one or more microcontrollers which cooperate to perform a polishing sequence in accordance with the invention. Data store 192 serves as a source of externally-provided data to the microcontrollers so they can perform the polish in accordance with user-supplied polishing parameters. It should be apparent that numerous configurations for providing user-supplied polishing parameters are possible. Similarly, it should be clear that numerous approaches for controlling the constituent components of the CMP are possible.

Figure 2:
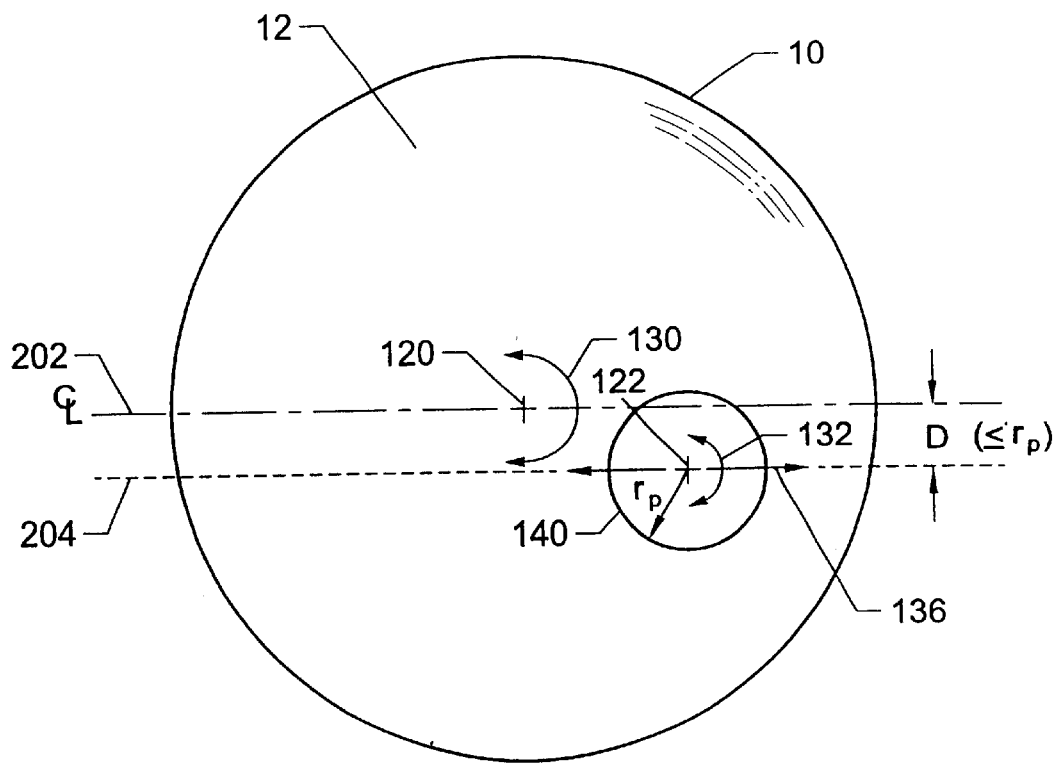
FIG. 2 is a simplified overhead view showing the surface of a wafer to be polished and a polishing pad according to an embodiment of the present invention.

FIG. 2 is an overhead view showing the arrangement of polishing pad 140 relative to process surface 12 of wafer 10. In accordance with the invention, the radial measure $r_p$ of pad 140 is smaller than the radial measure of wafer 10. As previously indicated, $r_p$ is typically 20% of the radius of wafer 10 although the pad can be smaller, or larger. The axis of rotation 120 of wafer 10 has an associated center line 202 passing through the axis. As indicated in FIG. 2, the direction of rotation 130 of wafer 10 can be in the clockwise or counterclockwise direction.

During polishing, pad 140 is translated by traverse mechanism 150 along a path 204 that is substantially parallel to centerline 202. Traversal path 204 is defined by the path of the axis of rotation 122 of pad 140. The separation distance D between centerline 202 and traversal path 204 is referred to as the "pad offset distance." More specifically, the "pad offset distance" is a certain minimum radial distance between the axis of rotation 122 of pad 140 and the axis of rotation 120 of a wafer 10. Selection of the "optimal" minimal distance will be discussed below.

With respect to FIG. 2, the offset distance also happens to be the perpendicular distance between centerline 202 and path 204 since the centerline is parallel to the linear traversal path. The polishing pad 140 rotates about its axis 122 in either the clockwise or the counterclockwise direction which is identified by reference numeral 132.

Figures 3A, 3B:
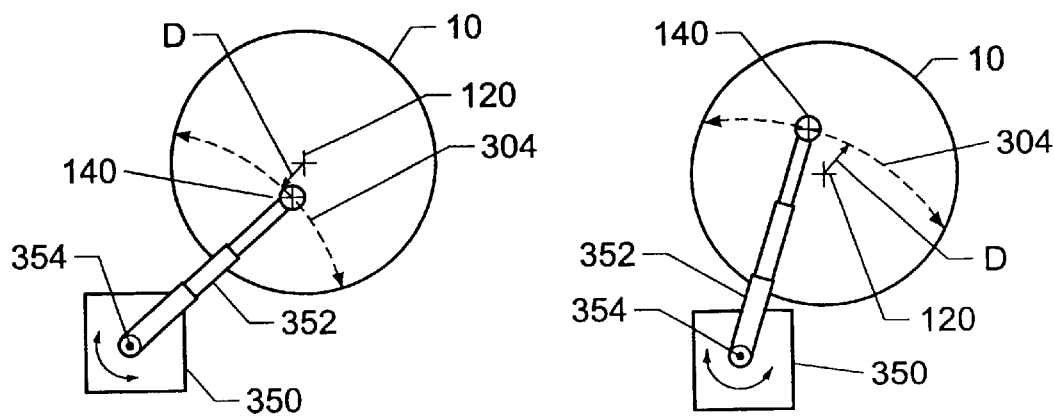
FIGS. 3A–3E are simplified overhead views illustrating the general pad traversal paths possible with the present invention.
Figure 3C:
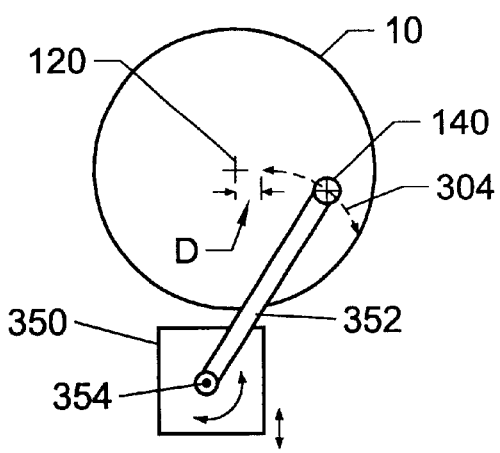
Figure 3D:
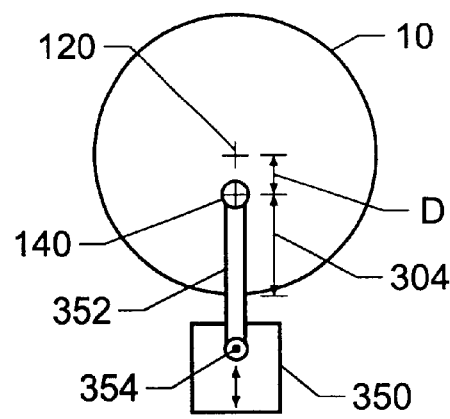
Figure 3E:
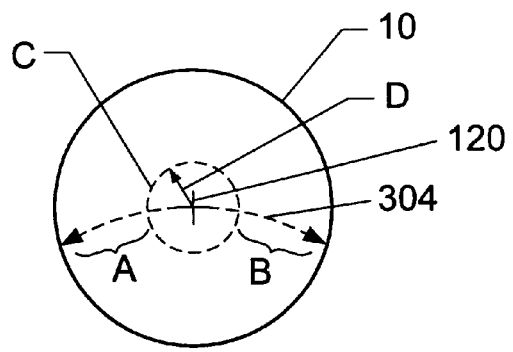
Figure 4:
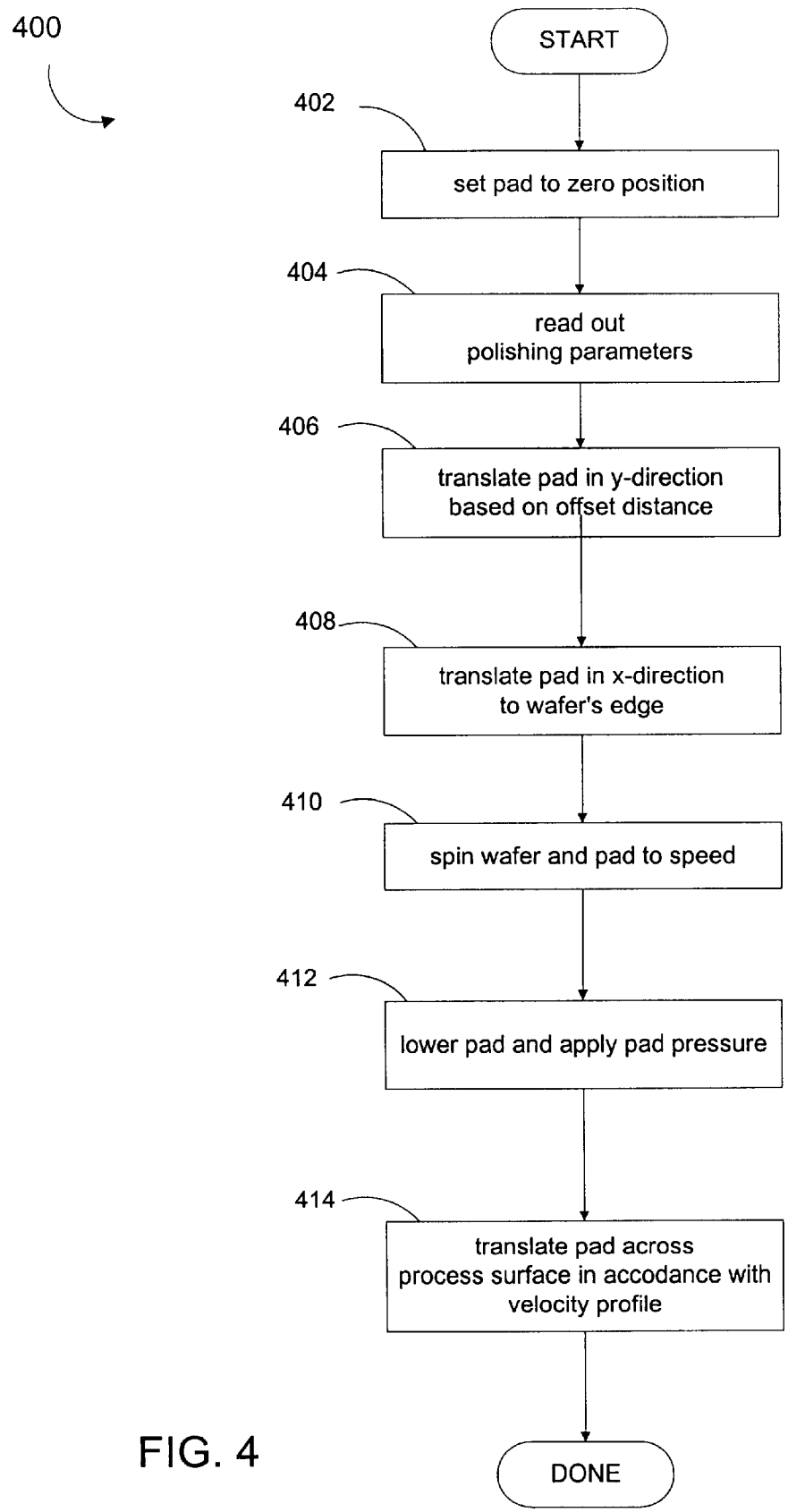
FIG. 4 is a summary of the general steps of a polishing operation performed in accordance with the invention.

FIGS. 3A–3E further illustrate the meaning of the "pad offset distance." FIGS. 3A and 3B show that a pad traversal path 304 need not be strictly linear as shown in FIG. 2. Instead, the path can be arcuate, and in general can be any curvilinear shape. In the more general case, the traversal path can be a discontinuous path, comprising segments of linear and/or curvilinear traverses across portions of the wafer surface. FIGS. 3A and 3B show that pad 140 is connected to a drive mechanism 350. The drive mechanism includes a telescoping arm 352 which can be rotated about axis 354. As shown in FIGS. 3C–3E, the arm is preferably a fixed length member which can be radially adjusted. By virtue of the combined radial and arcuate motion of the arm 352, the polishing pad 140 can be carried along any arbitrary traversal path across wafer 10. As shown in FIGS. 3A and 3B, the traversal path includes a point where its minimum separation from the wafer axis 120 is substantially equal to the offset distance, D.

Recall that the pad offset distance is defined as the radial distance between the pad axis 122 and the axis of rotation 120 of the wafer. FIGS. 3C–3E show alternative configurations of the drive mechanism 350 and arm 352 that are consistent with the notion of an offset distance. FIGS. 3C and 3D show an arrangement wherein the arm 352 is a fixed-length member and the drive mechanism 350 is translatable. FIG. 3C shows that the pad traversal path 304 can begin at the wafer edge, advances towards the wafer axis until the offset distance is reached, and reverse in direction back toward the wafer edge. Alternatively, the traversal path can begin at the wafer center, advance toward the edge, and reverse in direction back to the center. In either case, the path is an arcuate, reciprocating motion. FIG. 3D shows a linear reciprocating motion similar to that of a read-write head of a disk drive. In the general case, the traversal path could wind its way across the wafer surface, about its axis so long as the offset distance is not violated; i.e., the pad axis does not come closer than the offset distance to the wafer axis.

FIG. 3E shows yet another configuration wherein the traversal path is defined irrespective of the wafer axis 120, as emphasized in the figure where the traversal path 304 passes through the center of the wafer. The path passes through three regions A, B, and C. When pad axis 122 lies within either region A or region B, a pad downforce is provided to bring the pad into contact with the wafer surface to produce a polishing action of the wafer 10. When the pad axis lies outside of regions A and B—i.e., within circular region C which is defined by a radius substantially equal to the pad offset distance, D-pad downforce is absent and thus no polishing action. The pad can be taken off the surface of the wafer so that there is no contact with the wafer surface and hence no polishing action. Alternatively, the pad may remain in contact with the wafer surface with insufficient pad downforce so as to have no significant polishing effect on the wafer surface.

In consideration of the foregoing, it is more accurate to talk about a "polish" path. On the one hand, the polish path is defined by the traversal of pad axis 122 such that the pad axis does not enter region C shown in FIG. 3E. On the other hand, the traversal of pad axis 122 may take it into region C so long as pad downforce is absent during incursions into region C. Thus, in the general case, a polish path defined in accordance with the present invention is a path where there is no polishing action of the surface whenever pad axis 122 comes within region C. This may be achieved by defining the traversal path of pad axis 122 to lie outside of region C, or by removing pad downforce whenever the traversal path takes the pad axis into region C. It is important to note that the total absence of downforce is not necessary. The invention simply calls for a sufficient decrease in pad downforce so that there is insignificant polishing action on the surface, which will dependent on the properties of the material being polished, the abrasive properties of the polishing pad, the slurry used, and so on.

A polishing operation in accordance with the invention will now be discussed with reference to FIGS. 1–4. First, in step 402, traverse mechanism 150 is operated to locate polishing pad 140 at a zeroed-out position. As will be made clear, the zero position of pad 140 is preferably one in which the axis of rotation 122 of the pad is coincident with the axis of rotation 120 of the wafer.

In step 404, the polishing parameters are read out of data store 192. They include: an offset distance D which specifies the separation along the y-axis 138 between wafer axis 120 and pad axis 122. There is a wafer rotational speed which specifies the number of revolutions per minute the wafer is spun during a polishing operation. There is a pad spindle speed which specifies how fast the spindle is spun during a polish operation. A downforce setting specifies the pad pressure upon the surface of the wafer. A velocity profile which, as will be explained below, controls the traversal speed of the pad during a polish operation. A pad traversal count specifies the number of passes the pad makes across the wafer surface.

The x-y translation stage is operated in step 406 to translate pad 140 in the y-direction 138 by an amount sufficient to separate axes 120 and 122 by a distance equal to pad offset distance D. Recall that the traversal path illustrated in FIG. 2 is a linear path, though in general this is not a necessary condition. However, it can be seen that the polishing operation is facilitated by translating only in the x-direction. By setting the pad axis at the offset distance and making a linear translation, there is no need to monitor for how close the pad axis 122 will approach the wafer axis 120. The linear traverse guarantees a minimum separation substantially equal to the offset distance D.

Next in step 408, stage 150 is operated to position pad 140 at or near the edge of wafer 10. The wafer and pad are then spun up to speed in step 410 based on the wafer speed and the spindle speed respectively. The pad is lowered onto process surface 12 of the wafer to apply a pressure equal to the specified downforce setting, step 412. The x-y stage then translates pad 140 in the x-direction 136, the traversal velocity being varied in accordance with a velocity profile (FIG. 5), step 414. As will be explained further below, a velocity profile dictates the speed of pad translation as a function of distance from the wafer axis as the pad moves across wafer surface 12.

Upon reaching the opposite end of the wafer, pad 140 is translated in the reverse direction again following the velocity profile, although in reverse this time. This is repeated for one or more times as specified by the pad traversal count. During polishing, a slurry may be applied to the process surface to facilitate the polish operation. In the case of a slurry-less pad, no slurry is used during the polishing procedure.

Figure 6A:
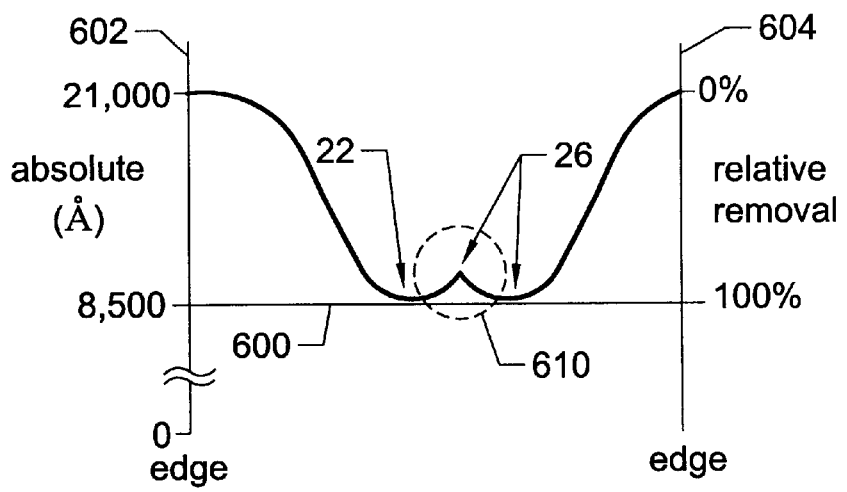
FIGS. 6A–6C are diagrammatic illustrations of typical removal profiles.
Figure 6B:
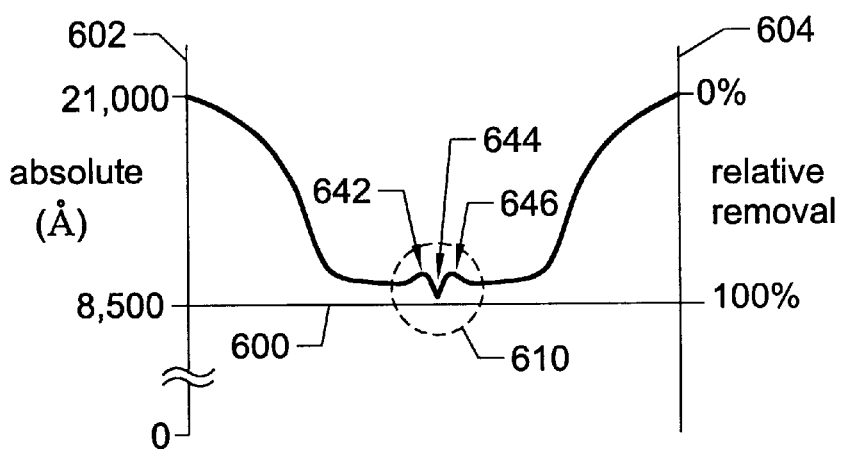
Figure 6C:
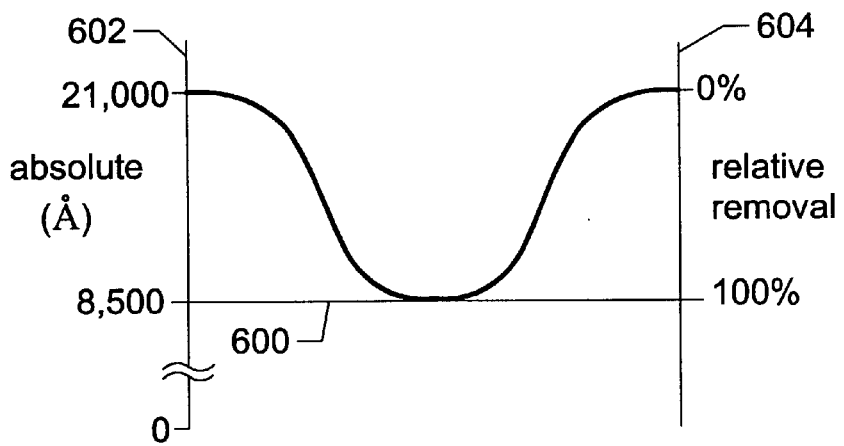

Referring to FIGS. 6A–6C, a wafer "removal profile" shows the removal pattern of material from its process surface as measured along the centerline 202 of the wafer using a constant-velocity pad traversal. These figures are simplified illustrations, but nonetheless representative of, observed removal profiles, intended to facilitate the explanation of certain features of removal profiles in connection with the present invention. The horizontal scale 600 represents distance from one edge of the wafer to its diametrically opposite edge. The vertical axis indicates surface thickness of remaining film material, with the highest regions occurring at the ends of the wafer. Two vertical scales are shown: an absolute scale 602 and a relative scale 604. The absolute scale 602 shows thickness measurements for the film being removed. For example, in FIG. 6A, absolute scale 602 indicates that the low point of the wafer measures 8500 Å from some reference point indicated in the figure by a measurement of "0", and the high point is 21,000 Å from that reference point. The maximum variation in thickness is therefore 12,500 Å.

The relative scale 604 is expressed as a percentage and is computed for each removal profile. The relative scale indicates percentage of material removed from the wafer surface. During the polish, material is removed everywhere on the wafer surface. However, the relative scale normalizes the range between the maximum surface height and the minimum surface height. Thus, the surface region where the surface height is maximum represents 0% removal of material, even though some surface material had actually been removed. The surface region where the surface height is minimum represents 100% removal of material.

It was discovered that depending on the pad offset distance D of the polishing pad, the removal profile of the polished wafer will generally have the appearance of one of the three profiles shown in FIGS. 6A–6C. Typical offset distances range between 1–30 mm, depending on the pad size. If the pad offset is too small (i.e., too close to wafer axis 120), then the resulting removal profile generally resembles the profile of FIG. 6A. If the pad offset is too large, then the resulting removal profile generally resembles the profile of FIG. 6B, a multi-lobed profile.

The removal profile shows that the rate at which the material is removed during polishing varies as a function of the position of the pad along its traversal path 204, since all other parameters (including pad traversal velocity) are held constant during polishing. It can be seen in FIGS. 6A and 6B that the removal rate increases in a smooth fashion as the pad moves from either end of the wafer towards the center of the wafer. However, it has been observed that for pad offset distances which are too large or too small there is a disruption of the removal of material as the pad approaches the center of the wafer. The rate at which the surface material is removed becomes erratic. The circled regions 610 in FIGS. 6A and 6B are exemplary of typical removal disruptions that have been observed. It is believed that uniform removal of surface material in the center region is quite difficult to achieve when such removal disruptions are present. It is believed that the removal disruptions cause erratic positive and/or negative deviations of surface height to occur proximate the center of the wafer. These observed dependencies of the shapes of the removal profiles were totally unexpected and their significance in achieving a smooth polish over a substantial portion of the wafer surface heretofore unknown.

It was observed that a removal profile resembling that of FIG. 6C can be obtained by carefully controlling the pad so that the separation between the pad axis and the wafer axis does not fall below an optimum value namely, the pad offset distance. It was further observed that a high degree of uniform removal of material across the wafer's process surface can be achieved by observing the optimum offset distance and translating the pad with a velocity profile that is an inverse of the corresponding removal profile. The velocity profile is produced by mapping the percentage removal values of the removal profile directly to the percentage velocity values of the velocity profile.

Figure 5:
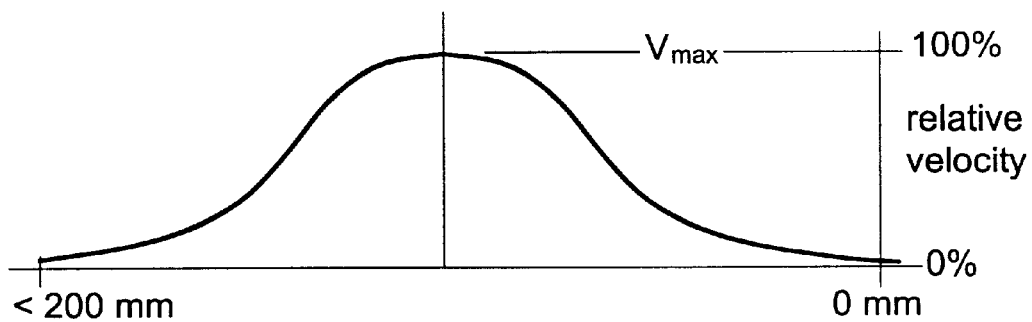
FIG. 5 is a simplified illustration of a velocity profile used with the present invention, highlighting those aspects of the velocity profile relevant to the invention.

Consequently, as can be seen in FIG. 5, the resulting velocity profile has a Gaussian- or bell-shaped characteristic to its curve. The horizontal axis indicates a distance from one end of the wafer. Here, the profile is for a 200 mm wafer, one end of which is marked off as "0 mm", the other end of which is marked as "<200 mm". The profile may not span the full diameter of the wafer. For example in FIG. 2, where the traversal path 204 is linear, the offset distance D positions the pad's line of traversal off the diametric center line 202. The traversal distance will be less than the diameter of the wafer in that case. Hence, the "less-than" sign notation at the 200 mm marking. In the more general case, the traversal path may wind its way about the wafer surface and thus exceed the diametric measurement of the wafer.

During a polish operation, the translational speed of pad across the face of the wafer will be varied in accordance with the profile. Thus, the pad will typically have a maximum translational speed $v_{max}$ at or near the center of the wafer, with near-minimum translational speed at or near the edges of the wafer. Since the removal profile exhibits a smooth rate of removal across the entire width of the wafer, the compensation scheme discussed in connection with FIGS. 4 and 5 can achieve a highly uniform removal of surface material, especially in the center region.

Since the removal rate of material is relatively low near the edges of the wafer, the slower traversal speed of the pad provides more polishing time precisely where the additional time would be most beneficial. As the pad approaches the center where removal rate of material is increased, its traversal speed is correspondingly increased so that the center of the wafer experiences a lesser amount of polishing time. It can be seen that it is important the removal profile exhibit a smooth transition in the region about the center of the wafer. A smooth transition indicates a correspondingly smooth rate of change of the removal rate of surface material. This allows for predictably varying the speed of pad traversal to compensate for the changing rate of removal of material as the pad is translated across the wafer surface. If the transition is erratic, such as shown in the circled area 610 of FIGS. 6A and 6B, then it would be exceedingly difficult to vary the translation speed of the pad adequately to compensate for the erratic behavior. It is believed that these erratic transitions are stochastic in nature and therefore irreproducible from one wafer to the next.

A pad traversal path which violates the offset distance will result in removal disruptions, thus rendering exceedingly difficult the attainment of a uniform polish because of the erratic removal rate that results by such a deviation. In fact, it has been observed that deviations as little as 0.25 mm (i.e., 0.25 mm less than the offset distance) can cause disruption of the removal of material at the center of the wafer.

Figure 7:
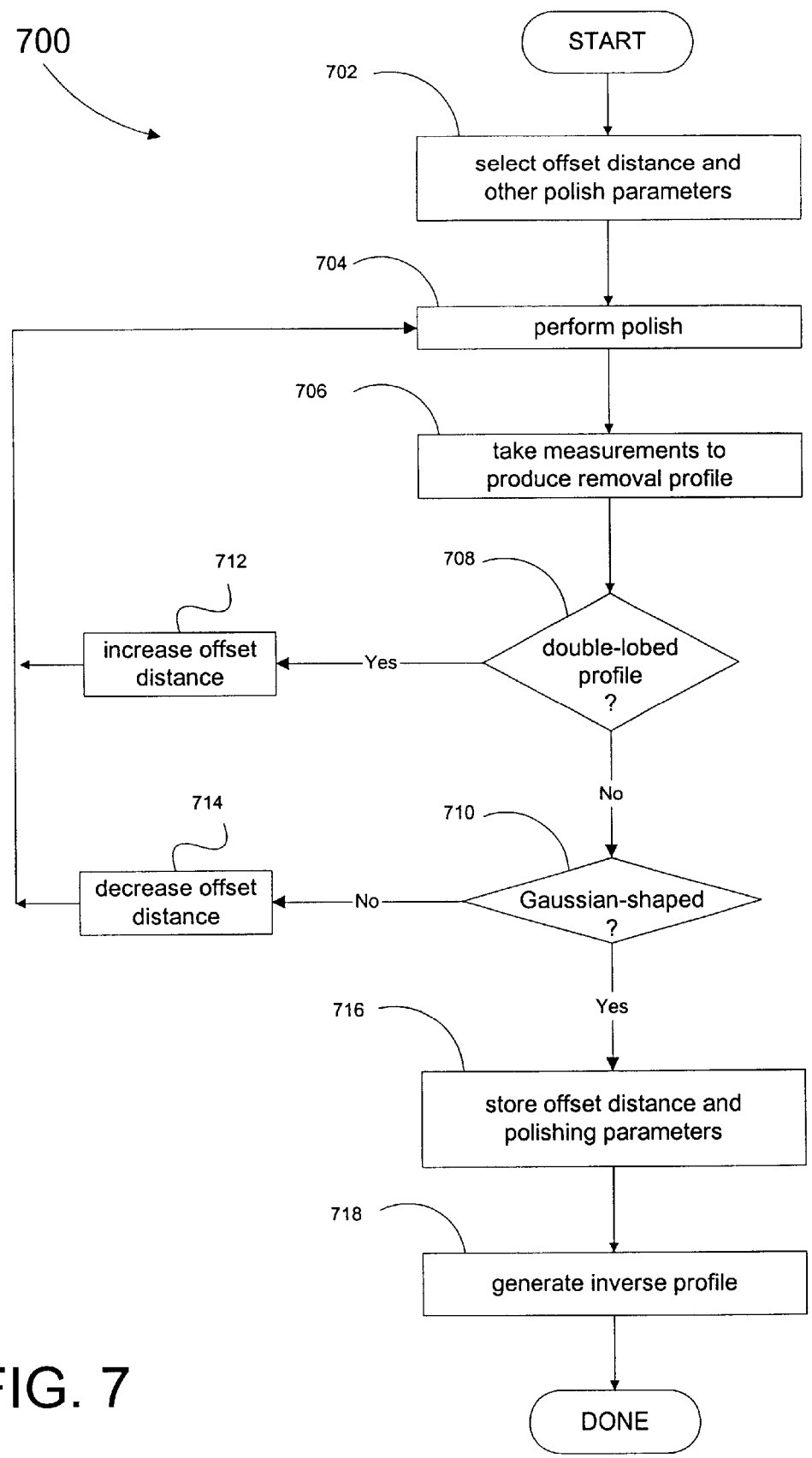
FIG. 7 is a summary of the general steps for determining an offset distance in accordance with the invention.

Referring now to FIG. 7, the general steps for obtaining the foregoing described velocity profile and the offset distance D will be described. Obtaining these parameters involves polishing a series of test wafers. The procedure involves selecting the following polishing parameters: downforce setting; wafer rotation speed; and pad spindle speed (step 702). For example, for a set of 200 mm blanket TEOS wafers, a pad with resilient backing (1.38φ) was selected. The pad was applied to the process surface with a constant downforce setting of 13 psi. The wafer was spun at a speed of 87 rpm, and the spindle speed was 787 rpm. A noteworthy observation at this point is that these settings can be dynamic rather than statically set. For example, the downforce setting can be varied as the pad is translated across the process surface. Likewise, the wafer or spindle speed can be varied during the polishing procedure.

In accordance with the invention, the translation speed of pad 140 is maintained constant for the purpose of determining the velocity profile and optimal pad offset distance D. For the foregoing conditions, the pad traversal speed was approximately 0.053 in/sec; this translates to a traversal across an eight inch wafer over a period of 2½ minutes. An initial pad offset distance $D_1$ is selected. This distance can be some value less that the pad radius, or a distance slightly off from wafer axis 120. The pad axis 122 is spaced apart from the wafer axis by an amount substantially equal to $D_1$. The wafer and pad are spun up to speed.

A polishing sequence is then initiated, step 704. This involves bringing the pad down upon the process surface proximate one edge of the wafer and translating the pad across the surface at a constant velocity. Preferably, but not necessarily, the pad is translated in a linear fashion. In the preferred mode then, when the pad is linearly translated, the direction of pad translation is reversed upon reaching an edge of the wafer. It was observed that good results were for the above conditions by making one pass for a total of two sweeps across wafer surface 12. More generally, the invention contemplates the possible use of higher traverse rates and polishing in N passes for a total of 2N sweeps across the wafer surface.

Next, in step 706, the surface height of the polished wafer taken along centerline 202 across the full diameter is measured to produce a removal profile. This measurement can be made with any commercially available measurement tool. In the case of thin film polishing, thin film optical measurement tools are available. Similarly, corresponding devices would be used for polishing silicon wafers, for hard disk polishing, and so on.

When the removal profile of the test wafer is determined, the next step is to analyze the removal profile, steps 708 and 710. If the profile exhibits what is referred to herein as a double-lobed structure (FIG. 7A), then the offset distance can be upwardly adjusted, step 712. Conversely, if the profile does not exhibit a Gaussian-shaped pattern (e.g., FIG. 7B), then the offset distance can be decreased, step 714.

Steps 704 through 714 are iterated for each new wafer, adjusting the pad offset each time, until a removal profile resembling the profile in FIG. 6C is obtained. For example, each adjustment might involve taking one-half of the difference between the current pad offset value and some maximum value, say a value slightly greater than the pad radius $r_p$. It has been observed that the incremental adjustments may become as small as 0.25 mm or less before the desired removal profile is attained.

At such time, the preferred offset distance $D_{pref}$ is stored along with the other polishing parameters, step 716. Next, the velocity profile is generated, step 718. The velocity profile is based on the removal profile corresponding to offset distance $D_{pref}$. More specifically, the velocity profile is the inverse of the removal profile, see FIG. 5. Thus during a polishing operation, the traversal velocity of the pad will be low near the wafer edges. Conversely, as the pad approaches the center of the wafer the velocity profile dictates that the pad traversal rate be increased.

Figure 8:
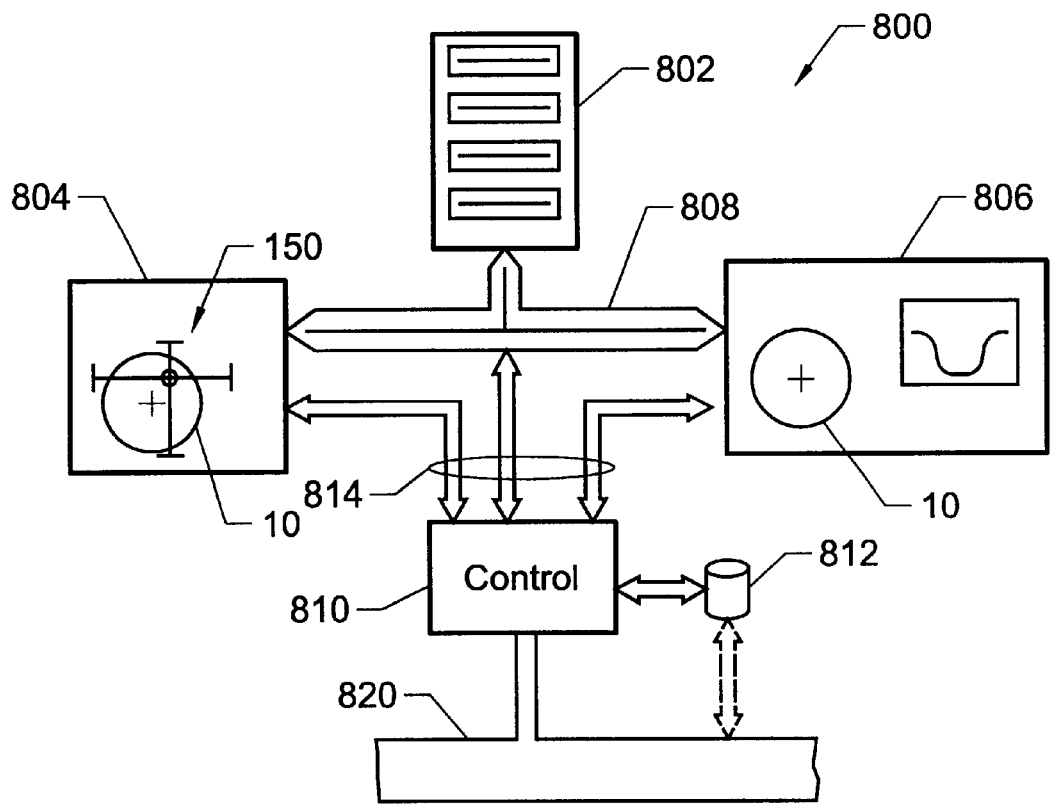
FIG. 8 is a simplified system block diagram of a CMP calibration system of the present invention.

Referring now to FIG. 8, a system 800 for a polishing apparatus in accordance with the invention will be discussed. It is noted that the figure is merely a simplified block diagram representation highlighting the components of the polishing apparatus of the present invention. The system shown is exemplary and should not unduly limit the scope of the claims herein. A person of ordinary skill in the relevant arts will recognize many variations, alternatives and modifications without departing from the scope and spirit of the invention.

Polishing system 800 includes a polishing station 804 for performing polishing operations. There is a wafer supply 802 for providing blank test wafers and for providing production wafers. A measurement station 806 is provided for making surface measurements from which the removal profiles are generated. The polishing station 804, wafer supply 802 and measurement station 806 are operatively coupled together by a robotic transport device 808. A controller 810 includes control lines and data input lines 814 which cooperatively couple together the constituent components of system 800. Controller 810 includes a data store 812 for storing at least certain user-supplied polishing parameters. Alternatively, data store 812 can be a remotely accessed data server available over a network in a local area network.

Controller 810 can be a self-contained controller having a user interface to allow a technician to interact with and control the components of system 800. For example, controller 810 can be a PC-type computer having contained therein one or more software modules for communicating with and controlling the elements of system 800. Data store 812 can be a hard drive coupled over a communication path 820, such as a data bus, for data exchange with controller 810.

In another configuration, a central controller (not shown) accesses controller 810 over communication path 820. Such a configuration might be found in a fabrication facility where a centralized controller is responsible for a variety of such controllers. Communication path 820 might be the physical layer of a local area network. As can be seen, any of a number of controller configurations is contemplated in practicing the invention. The specific embodiment will depend on considerations such as the needs of the end-user, system requirements, system costs, and the like.

The apparatus diagrammed in FIG. 8 can be operated in production mode or in calibration mode. During a production run, wafer supply 802 contains production wafers. During a calibration run, wafer supply 802 is loaded with test wafers. Measurement station 806 is used primarily during a calibration run to perform measurements on polished test wafers to produce removal profiles. However, measurement station 806 can also be used to monitor the quality of the polish operation during production runs to monitor process changes over time.

In another embodiment, measurement system 806 can be integrated into polishing station 804. This arrangement provides in situ measurement of the polishing process. As the polishing progresses, measurements can be taken. For production wafers, these real time measurements allow for fine tuning of the polishing parameters to provide higher degrees of uniform removal of the film material. For a calibration run, in situ monitoring provides for simultaneous measurement during the polishing step, thus reducing the time to perform a calibration.

Figure 9:
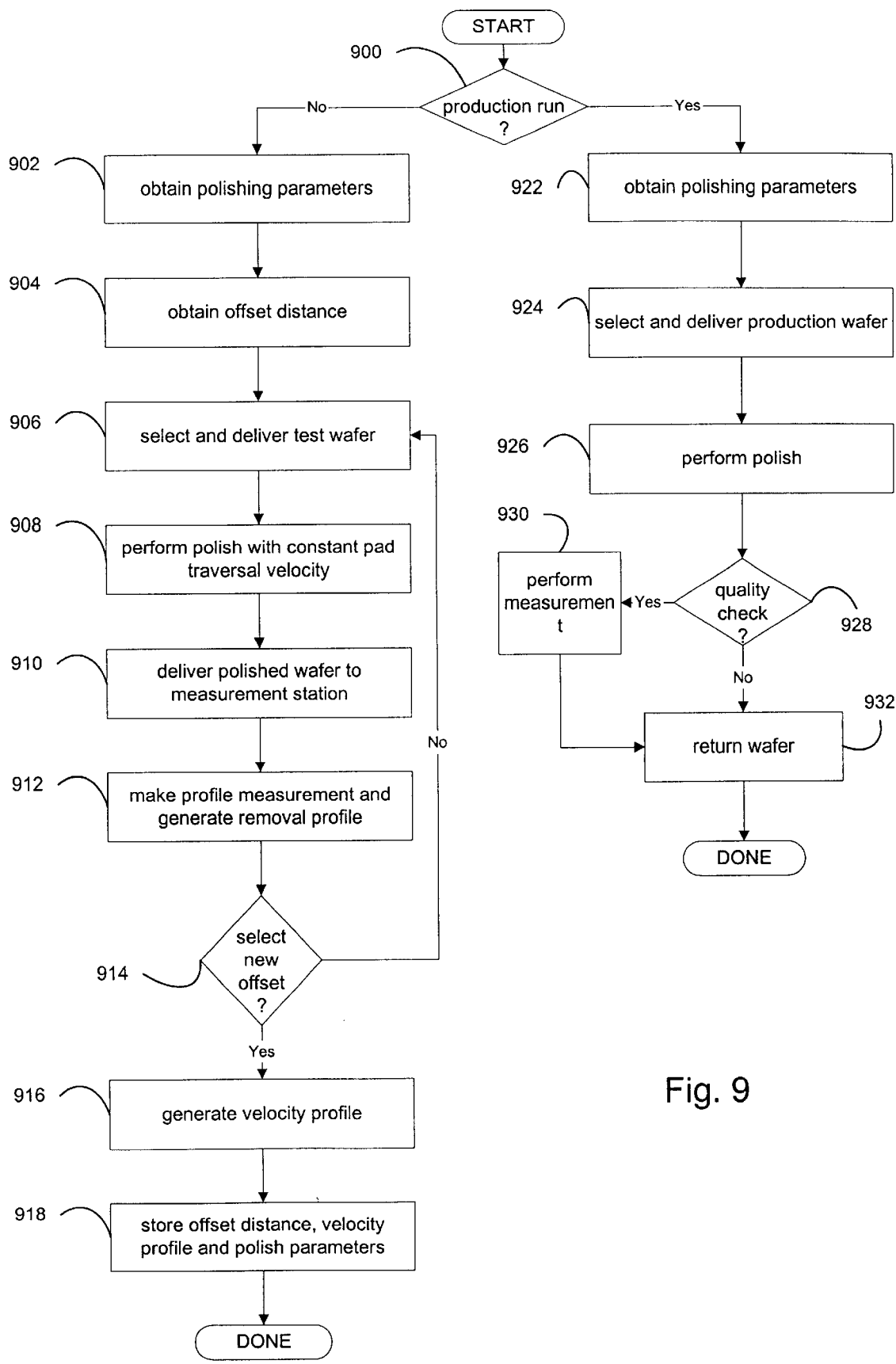
FIG. 9 is a simplified block diagram of the software components used with the CMP calibration system presented in FIG. 8.

Refer now to FIGS. 8 and 9 for a discussion of the software used in conjunction with the apparatus of FIG. 8. FIG. 9 is a function diagram highlighting the functions and processing flow provided by the software. The software is primarily resident in controller 810. However, it is understood by those skilled in the relevant arts that polishing station 804 can include control hardware (e.g., a microcontroller) and specialized control software to implement the functionality specific to the polishing function. Similarly, it is understood that measurement station 806 can include one or more microcontrollers and associated software to make the requisite measurements. The specific organization and distribution of the software components of system 800 will be dictated by factors such as available hardware and the functionality available in the components of system 800. For the purposes of the following discussion, it will be understood that the phrase "system software" (or more simply "the software") refers to the overall software which ensures cooperation among the components of system 800 to perform the described tasks, irrespective of the actual location of the software.

Continuing with FIG. 9, the system software receives an indication from a user whether to perform a production run or to make a calibration run, step 900. In the case of a calibration run, the software will first select (step 902) the polishing parameters. This can be achieved in any of a number of ways, including querying the user for such information, by using default settings, by using settings based on the wafer material, and so on. In step 904, the software selects an initial offset distance. Next, the software operates robotic device 808 to obtain a test wafer from wafer supply 802 and deliver it to polishing station 804, step 906. In step 908, a polish operation is performed in accordance with the procedure described in FIG. 7. Upon completion of the polish, the software operates the hardware to transfer the polished test wafer to measurement station 806, step 910). There, the software makes the necessary measurements on the polished wafer from which the corresponding removal profile is produced, step 912.

Based on the characteristics of the removal profile, the software determines whether to change the offset distance and repeat the procedure with a second test wafer, step 914. FIGS. 6A and 6B illustrate the presence of multiple inflection points and/or discontinuities characteristics that can be detected by the software when making its decision. For example, FIG. 6A shows a double-lobed structure 622, 624 with a discontinuity 626 occurring between the lobes. FIG. 6B shows ripple-type discontinuities 642, 644, and 646. The removal profile of FIG. 6C, however, exhibits a smooth transition with a single inflection point. These characteristics can be analyzed and readily detected using known image processing techniques.

If the removal profile indicates an adjustment of the offset distance is required, then a second offset distance is selected. This is done in accordance with the procedure described above in connection with the steps of FIG. 7. Processing then continues with step 906. Otherwise, processing proceeds to step 916 where the velocity profile is determined from the removal profile. In step 918, all the polishing parameters are stored in data store 812, including the offset distance and the velocity profile.

Returning to decision step 900, if a production run is selected, then processing proceeds to step 922 where the software reads out the polishing parameters from data store 812. In step 924, the software operates robotic device 808 to retrieve a production wafer from wafer supply 802 and deliver it to polishing station 804. The software then controls the polishing station to perform a polish operation in accordance with the polish parameters, step 926. The polishing operation proceeds in the manner discussed above in connection with the steps of FIG. 4.

Upon completion of the polish, a decision is made whether to make a quality check. This can be specified by the user or automatically performed. The quality check can be made for each wafer, on a random sampling basis, and so on. If a quality measurement is to be performed, the software operates robotic device 808 to transfer the polished wafer to measurement station 806 and make appropriate measurements. The measurements can be the same as for a calibration run, or they may be more or less comprehensive. The number and types of measurements will depend on the quality metrics of interest. In step 932, the wafer is returned to wafer supply 802.

The program code constituting the software can be expressed in any of a number of ways. The C programming language is a commonly used language because many compilers exist for translating the high-level instructions of a C program to the corresponding machine language of the specific hardware being used. For example, some of the software may reside in a personal computer (PC) to communicate with a servo controller card in one of its expansion slots. Other software may be resident in the underlying controlling hardware of the individual stations, e.g., polishing station 804 and measurement station 806. In such cases, the C programs would be compiled down to the machine language of the microcontrollers used in those stations.

Alternative controller configurations include the use of logic ladders implemented in a programmable logic controller (PLC). Computer numerical control programming methods are also contemplated. The selection of a particular control strategy and programming language will depend on the hardware being used the availability of a compiler for the target hardware, the availability of related software development tools, and so on, without departing from the scope and spirit of the present invention.

While the above is a full description of the specific embodiments, various modifications, alternative constructions and equivalents known to those of ordinary skill in the relevant arts may be used. For example, while the description above is in terms of a semiconductor wafer, it would be possible to implement the present invention with almost any type of article having a surface or the like. Therefore, the above description and illustrations should not be taken as limiting the scope of the present invention which is defined by the appended claims.

What is claimed is:

1. A chemical-mechanical polishing apparatus comprising:

a chuck assembly having a holder effective for receiving a wafer, said chuck assembly having a first axis of rotation a bout which a received wafer can be rotated;

a polishing pad assembly having a pad holder, said pad holder having a second axis about which an attached pad can be rotated;

a traverse mechanism to which said pad assembly is coupled, said traverse mechanism effective for translating said pad assembly along a traversal path across a surface of a received wafer, said traversal path defined with respect to said second axis; and a controller coupled to provide cooperative operation among said chuck assembly, said traverse mechanism, and said pad assembly to effectuate a polish operation of a received wafer, said controller having a first memory store containing data specifying an offset distance, said controller further having first program instructions effective for operating said traverse mechanism in a manner that the minimum separation between said first axis and said traversal path is substantially equal to said offset distance.

2. The apparatus of claim 1 wherein said controller further includes a second memory store containing data specifying a removal profile, said controller further including second program instructions effective for operating said traversal mechanism so as to vary the translation speed of said pad assembly in accordance with a velocity profile that is the inverse of the removal profile.

3. The apparatus of claim 1 wherein said controller further includes a second memory store containing data specifying a velocity profile; said controller further including second program instructions effective for producing a removal profile based on said velocity profile, third program instructions effective for operating said traversal mechanism so as to vary the translation speed of said pad assembly in accordance with said removal profile.

4. The apparatus of claim 1 wherein said traversal path is linear.

5. The apparatus of claim 1 wherein said traversal path is curvlinear.

6. The apparatus of claim 1 wherein said traversal path extends between an edge of a received wafer and a point having a radial distance from said first axis substantially equal to said offset distance.

7. The apparatus of claim 1 wherein said traverse mechanism is an x-y translation stage.

8. The apparatus of claim 1 wherein said traverse mechanism is a rotatable arm having either a fixed or an adjustable radial position.

9. A chemical-mechanical polishing apparatus comprising:

a chuck assembly having a holder effective for receiving a wafer, said chuck assembly having a first axis of rotation about which a received wafer can be rotated;

a polishing pad assembly having a pad holder, said pad holder having a second axis about which an attached pad can be rotated, said pad assembly effective for providing a pad downforce sufficient to produce a polishing action on a surface of a received wafer;

a traverse mechanism to which said pad assembly is coupled, said traverse mechanism effective for translating said pad assembly along a traversal path across a surface of a received wafer, said traversal path defined with respect to said second axis; and a controller coupled to provide cooperative operation among said chuck assembly, said traverse mechanism, and said pad assembly to effectuate a polish operation of a received wafer, said controller having first program instructions effective for operating said pad assembly so that a pad downforce is applied and removed depending on the separation between said first axis and said second axis.

10. The apparatus of claim 9 wherein said controller further includes a first memory store containing data specifying a removal profile, said controller further including second program instructions effective for operating said traversal mechanism so as to vary the translation speed of said pad assembly in accordance with a velocity profile that is the inverse of the removal profile.

11. The apparatus of claim 9 wherein said controller further includes a first memory store containing data specifying a velocity profile; said controller further including second program instructions effective for producing a removal profile based on said velocity profile, third program instructions effective for operating said traversal mechanism so as to vary the translation speed of said pad assembly in accordance with said removal profile.

12. The apparatus of claim 9 further including a first memory store containing data specifying an offset distance, wherein said first program instructions are further effective for removing said pad downforce when the separation between said first axis and said second axis is substantially equal to or less than said offset distance, thereby providing substantially no polishing action of said surface.

13. The apparatus of claim 12 wherein said controller further includes a second memory store containing data specifying a removal profile, said controller further including second program instructions effective for operating said traversal mechanism so as to vary the translation speed of said pad assembly in accordance with a velocity profile that is the inverse of the removal profile.

14. The apparatus of claim 12 wherein said controller further includes a second memory store containing data specifying a velocity profile; said controller further including second program instructions effective for producing a removal profile based on said velocity profile, third program instructions effective for operating said traversal mechanism so as to vary the translation speed of said pad assembly in accordance with said removal profile.

15. A system for calibration of polishing parameters in a chemical-mechanical polishing apparatus, comprising:

a polishing unit having a chuck assembly, a pad assembly, and a translation assembly, said pad assembly mounted to said translation assembly and arranged for positioning of said pad assembly over a wafer held by said chuck assembly, said pad assembly including a polishing pad, said polishing station including an associated measurement unit for determining a removal profile for a wafer;

a wafer supply to hold a plurality of wafers;

a wafer transport mechanism to transport wafers between said polishing unit and said wafer supply; and a controller unit comprising:
- control outputs coupled to said polishing unit and said wafer transport;
- a data store to store a plurality of removal profiles;
- first program instructions effective for producing control signals to transport a wafer between said wafer supply and said polishing unit;
- second program instructions to provide a first offset distance;
- third program instructions effective for producing control signals to perform a polishing operation including translating said pad along a traversal path, said traversal path being such that the minimal distance between the center of rotation of said chuck assembly and the center of rotation of said polishing pad is substantially equal to said offset distance;
- fourth program instructions effective for producing control signals to perform a measurement operation of a polished wafer to obtain data representing a removal profile; and
- fifth program instructions to determine a second offset distance based on said removal profile.

16. The system of claim 15 wherein the third program instructions are further effective for translating the pad across the wafer at a constant velocity.

17. The system of claim 15 further including sixth program instructions to produce a velocity profile that is the inverse of one of the stored removal profiles.

18. The system of claim 15 wherein said associated measurement unit is effective for providing in situ monitoring during a polish operation, thereby accumulating data during said polish operation.

19. The system of claim 15 wherein said associated measurement unit is separate from said polishing unit, wherein said wafer transport mechanism includes transporting wafers to and from said associated measurement unit.

* * * * *